United States Patent
Seery et al.

(10) Patent No.: US 8,413,391 B2
(45) Date of Patent: Apr. 9, 2013

(54) SOLAR ARRAY MOUNTING SYSTEM WITH UNIVERSAL CLAMP

(75) Inventors: Martin Seery, San Rafael, CA (US);
Robert H. J. Miros, Fairfax, CA (US)

(73) Assignee: Sunlink Corporation, San Rafael, CA (US)

( * ) Notice: Subject to any disclaimer, the term of this patent is extended or adjusted under 35 U.S.C. 154(b) by 665 days.

(21) Appl. No.: 12/250,242

(22) Filed: Oct. 13, 2008

(65) Prior Publication Data
US 2010/0089389 A1  Apr. 15, 2010

(51) Int. Cl.
*E04D 13/18*  (2006.01)
*E04H 14/00*  (2006.01)

(52) U.S. Cl. ........ 52/173.3; 248/237; 136/244; 126/600

(58) Field of Classification Search ............... 248/229.1, 248/229.15, 229.25, 237, 676, 677, 163.1, 248/636, 164; 52/173.3, 126.6; 136/244, 136/246, 251, 291; 126/600, 244, 608, 145
See application file for complete search history.

(56) References Cited

U.S. PATENT DOCUMENTS

| | | | |
|---|---|---|---|
| 3,358,952 A * | 12/1967 | Burns | ............................ 248/539 |
| 3,988,166 A | 10/1976 | Beam | |
| 4,204,523 A | 5/1980 | Rothe | |
| 4,226,256 A | 10/1980 | Hawley | |
| 4,336,413 A | 6/1982 | Tourneux | |
| 4,371,139 A | 2/1983 | Clark | |
| 4,389,533 A | 6/1983 | Ames | |
| 4,476,853 A | 10/1984 | Arbogast | |
| 4,611,090 A | 9/1986 | Catella et al. | |
| 4,620,771 A | 11/1986 | Dominguez | |
| 4,636,577 A | 1/1987 | Peterpaul | |
| 4,649,675 A | 3/1987 | Moldovan et al. | |
| 4,652,890 A * | 3/1987 | Crean | ............................ 343/882 |
| 4,674,244 A | 6/1987 | Francovitch | |
| 4,677,248 A | 6/1987 | Lacey | |
| 4,718,404 A | 1/1988 | Sadler | |
| 4,724,010 A | 2/1988 | Okaniwa et al. | |
| 4,832,001 A | 5/1989 | Baer | |

(Continued)

FOREIGN PATENT DOCUMENTS

| DE | 2602814 | 4/1977 |
|---|---|---|
| DE | 2758067 | 5/1979 |

(Continued)

OTHER PUBLICATIONS

Imamura et al.., "Photovoltaic System Technology" 1992 European Handbook, pp. 340-366.

(Continued)

*Primary Examiner* — Joshua J Michener
*Assistant Examiner* — Chi Q Nguyen
(74) *Attorney, Agent, or Firm* — Reed Smith LLP (57) ABSTRACT

A mounting system for photovoltaic solar panels providing support for different sized panels, and/or panels having mounting holes located in different locations. A universal panel clamp includes at least one elongated hole or slot to attach to a mounting hole on a solar panel frame. A clamp is attached to an upper hole, and a second clamp is attached to a lower mounting hole. The upper clamps are attached to an upper lateral support member, and the lower clamps are attached to a lower lateral support member. This assembly may be supported by A-shaped support members having adjustable tilt arms, or posts with specially configured brackets.

16 Claims, 9 Drawing Sheets

U.S. PATENT DOCUMENTS

| | | | |
|---|---|---|---|
| 4,886,554 | A | 12/1989 | Woodring et al. |
| 4,922,264 | A | 5/1990 | Fitzgerald et al. |
| 4,936,063 | A | 6/1990 | Humphrey |
| 5,112,408 | A | 5/1992 | Melchior et al. |
| 5,125,608 | A * | 6/1992 | McMaster et al. ......... 248/163.1 |
| 5,142,293 | A | 8/1992 | Ross |
| 5,164,020 | A | 11/1992 | Wagner et al. |
| 5,228,924 | A | 7/1993 | Barker et al. |
| 5,249,156 | A * | 9/1993 | Hagiwara et al. ............. 365/228 |
| 5,295,646 | A * | 3/1994 | Roth ............................... 248/58 |
| 5,338,369 | A | 8/1994 | Rawlings |
| 5,409,549 | A | 4/1995 | Mori |
| 5,505,788 | A | 4/1996 | Dinwoodie |
| 5,524,401 | A | 6/1996 | Ishikawa et al. |
| 5,526,896 | A * | 6/1996 | O'Rourke ........................ 182/3 |
| 5,542,359 | A * | 8/1996 | Polries ............................ 108/26 |
| 5,647,444 | A * | 7/1997 | Williams ....................... 175/209 |
| 5,969,501 | A * | 10/1999 | Glidden et al. ............... 320/101 |
| 6,036,107 | A * | 3/2000 | Aspen et al. .................. 239/170 |
| 6,201,181 | B1 * | 3/2001 | Azzam et al. ................. 136/244 |
| 6,273,372 | B1 * | 8/2001 | Heath ............................. 248/62 |
| RE38,988 | E | 2/2006 | Dinwoodie |
| 2003/0070368 | A1 | 4/2003 | Shingleton |
| 2007/0079865 | A1 | 4/2007 | Warfield et al. |

FOREIGN PATENT DOCUMENTS

| | | |
|---|---|---|
| DE | G7913751.2 | 12/1979 |
| DE | 2919901 | 11/1980 |
| DE | 3926967 | 2/1991 |
| DE | 3934485 | 4/1991 |
| DE | G9114555.4 | 2/1992 |
| DE | G9114556.2 | 2/1992 |
| DE | 4232367 | 5/1993 |
| DE | 29503315.0 | 2/1995 |
| DE | 29719513 U1 | 3/1998 |
| DE | 29804621 U1 | 9/1998 |
| DE | 19811399 A1 | 9/1999 |
| DE | 19823356 A1 | 11/1999 |
| DE | 20008509 U1 | 9/2000 |
| DE | 20011063 U1 | 10/2000 |
| DE | 29724278 U1 | 12/2000 |
| DE | 20120983 U1 | 5/2002 |
| DE | 20200072 U1 | 7/2002 |
| DE | 20200672 U1 | 7/2002 |
| DE | 20218424 U1 | 3/2003 |
| DE | 69815162 T2 | 4/2004 |
| DE | 69815168 T2 | 4/2004 |
| DE | 202005003750 U1 | 6/2005 |
| DE | 29610516 U1 | 9/2006 |
| DE | 60032292 T2 | 7/2007 |
| DE | 102006026297 B3 | 8/2007 |
| EP | 0282826 B1 | 12/1991 |
| EP | 0489791 B1 | 2/1993 |
| EP | 0436572 B1 | 2/1995 |
| EP | 0531869 B1 | 8/1997 |
| EP | 0857926 A1 | 12/1998 |
| EP | 1071136 | 1/2001 |
| EP | 1243717 A2 | 9/2002 |
| EP | 1243718 A2 | 9/2002 |
| EP | 1306907 A1 | 2/2003 |
| EP | 1376029 A2 | 2/2004 |
| EP | 0828034 A2 | 11/2005 |
| EP | 1788322 A1 | 5/2007 |
| EP | 1310747 B1 | 6/2007 |
| ES | 1061941 U | 1/2006 |
| ES | 1063823 | 6/2006 |
| ES | 1065162 | 6/2007 |
| WO | WO9003663 | 5/1990 |
| WO | WO2004000650 | 6/1993 |
| WO | WO94/00650 | 6/1994 |
| WO | WO0216707 A1 | 2/2002 |
| WO | WO02/063219 A1 | 8/2002 |
| WO | WO02073703 | 9/2002 |
| WO | WO02063219 | 12/2002 |
| WO | WO03038910 A2 | 5/2003 |
| WO | WO03083954 A2 | 9/2003 |
| WO | WO2004066324 | 5/2004 |
| WO | WO2004066324 A2 | 5/2004 |
| WO | WO2004063485 | 7/2004 |
| WO | WO2004063485 A2 | 7/2004 |
| WO | WO2005/020290 | 3/2005 |
| WO | WO2005059963 A1 | 6/2005 |
| WO | WO2006116398 A2 | 2/2006 |
| WO | WO2007135412 A1 | 11/2007 |
| WO | WO2008022179 A1 | 2/2008 |
| WO | WO2008022719 | 2/2008 |

OTHER PUBLICATIONS

Humm, et al., "Photovoltaik und Architektur Photovoltaics in Architecture" 1993, pp. 108-111.

Stefanakos, "Driving With the Sun: PV Electric Vehicle Recharging Station", 1993, pp. 15-16.

"Ejemplo 7, 15, 21: Electrificacion Explotacion Ganadera" pp. 149, 157, 163.

"Estructuras Soporte Para Paneles Futovoltaicos" pp. 6/1-6/17.

Avances técnicos, Comercial Cointra, S. S. pp. -7, 96, 97, 98.

"Solar Energy in Architecture and Urban Planning" Third European conference on Architecture, May 1993, pp. 231-235 , 282-286.

Gillett, et al. "Photovoltaic Demonstration Projects", Commission of the European Communities, 1991 pp. 127-135, 190-197, 347-353.

Michael R. Starr "Photovoltaic Power for Europe", Solar Energy R&D in the European Community, Commission of the European Communities, 1983, pp. 31-37, 42-47.

Buresch, "Photovoltiac Energy Systems Design and Installation", McGraw-Hill Book Company, 1983, pp. 201-211.

Commission of the European Communities, "First E.C. Conference on Solar Collectors in Architecture, Integration of Photovoltiac and Thermal Collectors in New and Old building Structures" Proceedings of the International Conference held at Venice, Italy, Mar. 1983, pp. 20-28 and pp. 108-120.

Russell "An Apprentice's Guide to Photovoltaics" Solar Age, 1981 pp. 32-36.

"Phovoltiacs for Pumping Water" Solar Age, 1984 pp. 64.

Schaefer, "What We Know About Rooftop Electricity" Solar Age, 1S84 pp. 19-26.

Weissman, "Photovoltaics for Utilities: Commercialization Through Collaboration" Solar Today pp. 31-33.

Soderberg, "Living Beyond the Top of the World" Solar Age, 1992, pp. 11-13.

Wolfe, "A Sunpowered Dream House" Solar Age, 1983, pp. 17-20.

"Today's Outstanding Photovoltaic Projects", Solar Age, Jun. 1985, pp. 40-45.

Vorwort, et al. "Photovoltaik und Architektur Photovoltaics in Architecture" 1993, pp. 108-111.

J. Chadjivassiliadis, et al. "Phovoltaic Demonstration Projects", Commission of the European Communities, 1991, pp. 127-.

"Ilectrification Explotacion Ganadera", Comercial Cointra, S.A. pp. -149, 147, 163, 6-17.

Russell, et al. "PV Array Designs for Flat-Roof Buildings" IEEE, 1993 pp. 1129-1133.

Sick, et al. "Photovoltaics in Buildings, A Design Handbook for Architects and Engineers", "Fraunhofer Institute for Solar Energy Systems ISE" pp. 143-144.

Strong, et al. "The Solar Electric House, A Design Manual for Home-Scale Photovoltaic Power Systems", Rodale Press 1987, pp. 225-234.

Joel Davidson, The New Solar Electric Home the Photovoltaics How-To-Handbook, 1987, aatec publications, pp. 138-152.

"Photovoltaics for Pumping Water, The Art & Science of Energy Remodeling Comparing Passive Water Heaters Wind Energy's Tough Dreamers", Solor Age, 1984, pp.

Emile, et al. "Brevet D'Invention", Ministère de la Production Endustrielle et du Travail.

Information Disclosure Statement and Form 1449 from U.S. Pat. Appl. No. 11/176,036.

International Search Report.

* cited by examiner

SOLAR ARRAY MOUNTING SYSTEM WITH UNIVERSAL CLAMP

BACKGROUND OF THE INVENTION

1. Field of the Invention

The present invention relates generally to a system for mounting and installing photovoltaic solar panels, and more particularly, to a mounting support system that can support photovoltaic solar panels manufactured by different vendors.

2. Description of the Related Art

With the continual rise in conventional energy costs, photovoltaic solar panels ("PV panels") are increasingly becoming cost competitive with other means of energy generation. These PV panels are being installed in sites of high energy usage such as on commercial building rooftops, in industrial open areas, and even on reclaimed wasteland. These energy systems, or power plants, vary in size but can cover many thousands of square feet on a building rooftop and many acres of land when installed on the ground. Ground mounted systems are especially attractive for large commercial power-generating installations, and locations with large available open space.

However, such large solar arrays require a sufficiently strong support structure to support not only the weight of the array, but to also provide sufficient resistance to wind forces. Tightly spaced panels effectively form a large surface area, which could result in damage to the panels, the support structure, or both, under strong wind conditions. In addition, these systems must accommodate a range of surface types and conditions, including grassy fields, bare earth, cement slabs, and gravel or crushed rock. These PV panel mounting structures must respond to the site conditions present, including following surface contours such as hills and valleys, earth that is difficult to drill or bore into, and they must withstand all possible weather conditions for a given location.

As a result, most ground mounted solar arrays are effectively custom designed for each installation. Factors considered include how many PV panels are to be used, what configuration of PV panels will generate the most power for a given site, what the annual weather patterns are, and how strong local wind conditions may be. Based on this information, the size of the mounting system is determined, such as, for example, the size of the necessary support rails, brackets and posts.

Most PV panels are formed with an aluminum frame around the panel, with mounting holes in the aluminum frame, on the back of the panel. The actual dimensions of the PV panels vary from manufacturer to manufacturer. Some PV panels are rectangular, while others have a more square aspect ratio. As a result, the location of the mounting holes varies depending on the manufacturer and the specific product. Thus, the designer of the mounting structure must also first know the exact model of PV panel to be used, in order to design an appropriate mounting structure. For mounting hardware manufactures, this may require the design of many different mounting brackets, increasing the costs associated with tooling and inventory control.

Alternatively, some support structure configurations use special "clips" to clip the solar panels onto the supporting rails. In one form, the clips may have a "T-shaped" slot that interfaces with a complementary rail. The clips slide onto the rail and are positioned in between the panels to secure the edges of the panels to the support rail. However, this requires that the clips be slid onto the rail from the ends of the rail. If a PV panel is defective and/or damaged and needs to be replaced, it is difficult to only remove a single panel. This type of mounting system also often requires extensive on-site placement, measurement, and adjustment on the part of the system installers. Moreover, these clips do not utilize the manufacturers' mounting holes, and therefore the installations may not meet the manufacturers' installation guidelines and/or invalidate warranties.

Thus, it would be desirable to have a mounting system for solar panel arrays that is adaptable to different sized PV panels, but that utilizes each panel's mounting holes.

SUMMARY OF THE INVENTION

In general, the present invention is a mounting system for photovoltaic solar panels providing support for different sized panels, which may have mounting holes located in different locations. A universal panel clamp includes at least one elongated hole or slot to attach to a mounting hole on a solar panel frame. A first clamp is attached to an upper hole, and a second clamp is attached to a lower mounting hole. The upper clamps are attached to an upper lateral support member, and the lower clamps are attached to a lower lateral support member. This assembly may be supported by A-shaped support members having adjustable tilt arms, or posts with specially configured brackets.

More particularly, in one embodiment, a mounting clamp for solar panels according to the present invention comprises a top section having at least one elongated slot for aligning with a mounting hole on a solar panel, a rear section, and mounting hardware to attach the top and rear sections together around a support member.

The elongated slot may be sized to accommodate solar panel mounting holes which are located in a band approximately 0.5" to 1.25" from an edge of a solar panel frame. Alternatively, the elongated slot may be sized to accommodate solar panel mounting holes which are located in a band approximately 0.25" to 2" from an edge of a solar panel frame. In a preferred embodiment, the top section comprises two elongated holes for aligning with mounting holes on adjacent solar panels in an array. Additionally, the mounting clamp may include a spacer fin to provide a fixed gap between adjacent solar panels.

In another embodiment, a solar panel mounting system according to the present invention comprises at least two A-shaped support frames, each A-shaped support frame including a top bracket, a tilt arm connected to an A-shaped support frame at a position along a front of the A-shaped support frame, a top lateral support member connected to each A-shaped support frame at each top bracket, a bottom lateral support member connected to each tilt arm, wherein each tilt arm is attached to an A-shaped support member at a location to align the bottom lateral support member with at least one bottom mounting hole on a solar panel frame, and a first solar panel clamp attached to the top lateral support member, and a second solar panel clamp attached to the bottom lateral support member, wherein the first and second panel clamps comprise a top section comprising at least one elongated slot for aligning with a mounting hole on a solar panel, a rear section, and mounting hardware to attach the top and rear sections together around a lateral support member.

The elongated slot may be sized to accommodate solar panel mounting holes which are located in a band approximately 0.5" to 1.25" from an edge of a solar panel frame. Alternatively, the elongated slot may be sized to accommodate solar panel mounting holes which are located in a band approximately 0.25" to 2" from an edge of a solar panel frame. In a preferred embodiment, the top section comprises two elongated holes for aligning with mounting holes on adjacent solar panels in an array. Additionally, the mounting clamp may include a spacer fin to provide a fixed gap between adjacent solar panels.

An alternate embodiment of the present invention comprises at least two mounting posts, a mounting bracket connected at a top of a mounting post, a top lateral support member connected to each mounting bracket, a bottom lateral support member connected to each mounting bracket at a location to align the bottom lateral support member with at least one bottom mounting hole on a solar panel frame, and a first solar panel clamp attached to the top lateral support member, and a second solar panel clamp attached to the bottom lateral support member, wherein the first and second panel clamps comprise a top section comprising at least one elongated slot for aligning with a mounting hole on a solar panel a rear section, and mounting hardware to attach the front and rear sections together around a lateral support member.

The elongated slot may be sized to accommodate solar panel mounting holes which are located in a band approximately 0.5" to 1.25" from an edge of a solar panel frame. Alternatively, the elongated slot may be sized to accommodate solar panel mounting holes which are located in a band approximately 0.25" to 2" from an edge of a solar panel frame. In a preferred embodiment, the top section comprises two elongated holes for aligning with mounting holes on adjacent solar panels in an array. Additionally, the mounting clamp may include a spacer fin to provide a fixed gap between adjacent solar panels.

BRIEF DESCRIPTION OF THE DRAWINGS

The present invention will be readily understood by the following detailed description in conjunction with the accompanying drawings, wherein like reference numerals designate like structural elements, and in which:

FIG. 5D' is a enlarged view of the tilt arm according to one embodiment of the present invention as installed in a system as shown in FIG. 5D;

FIG. 6C' is an enlarged view of the clamp of FIG. 6C;

FIG. 6D' is a enlarged view of the top of the two solar panels of FIG. 6D showing the clamp under and between the two solar panels;

DETAILED DESCRIPTION OF THE INVENTION

The following description is provided to enable any person skilled in the art to make and use the invention and sets forth the best modes contemplated by the inventor for carrying out the invention. Various modifications, however, will remain readily apparent to those skilled in the art. Any and all such modifications, equivalents and alternatives are intended to fall within the spirit and scope of the present invention.

Figures 1A, 1B, 1C, 1D:
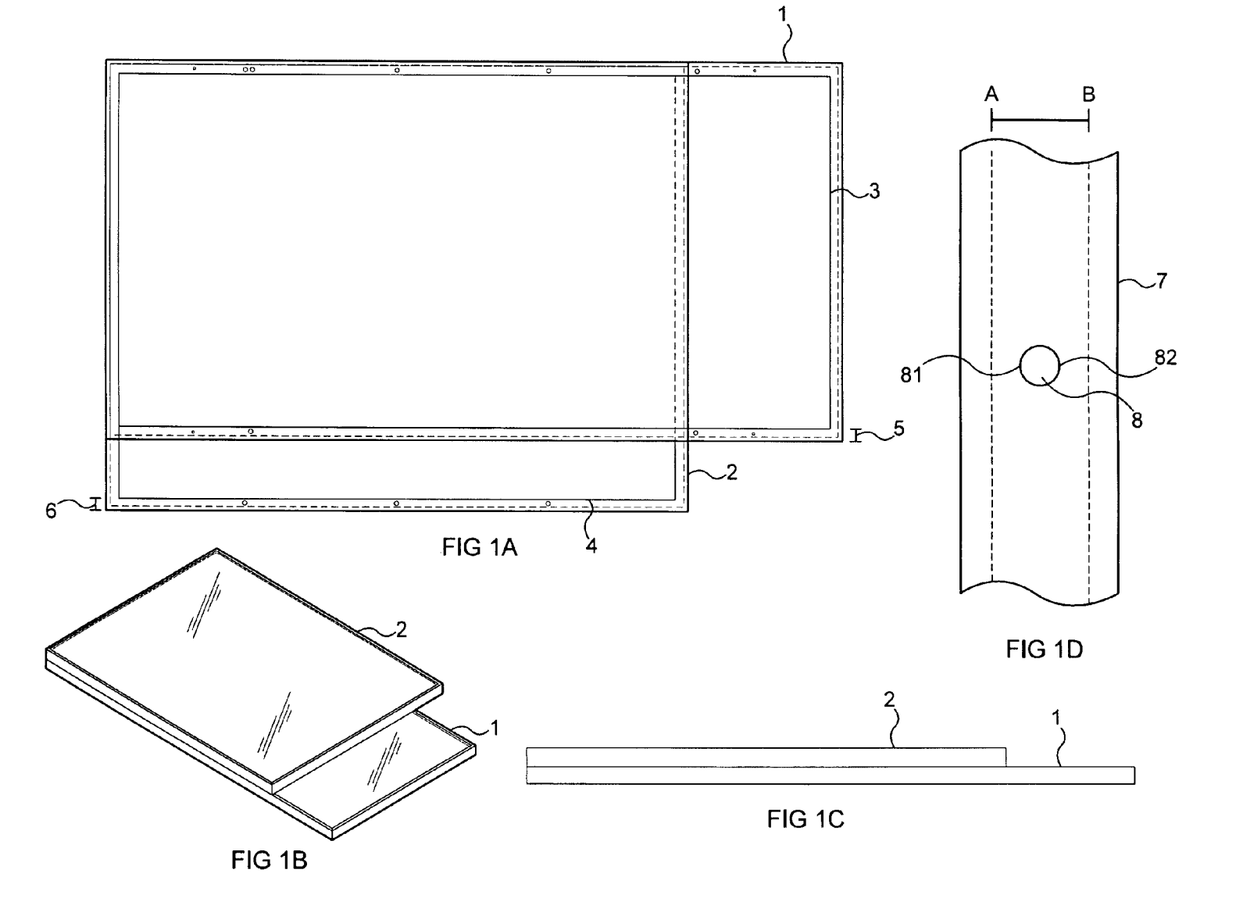
FIG. 1A is a bottom view of two solar panels having different dimensions.
FIG. 1B is a top perspective view of the panels of FIG. 1A.
FIG. 1C is a side view of the two panels of FIG. 1A.
FIG. 1D illustrates a possible range of positions of a mounting hole in solar panels of different sizes and/or from different manufacturers.
Figures 2A, 2B, 2C, 2D:
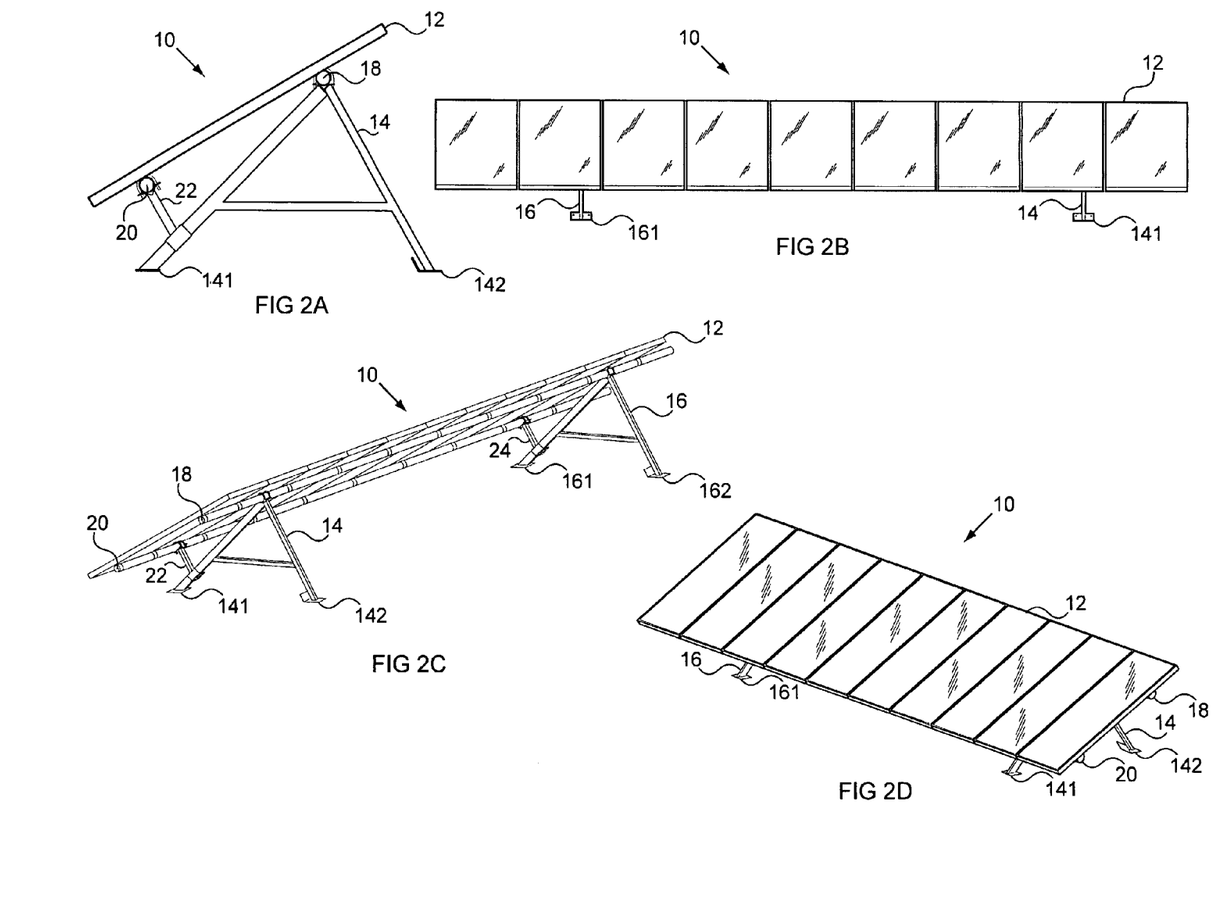
FIG. 2A is a side view of a solar panel mounting system according to one embodiment of the present invention.
FIG. 2B is a front view of the system of FIG. 2A.
FIG. 2C is a rear perspective view of the system of FIG. 2A.
FIG. 2D is a front perspective view of the system of FIG. 2A.

As described above, photovoltaic solar panels may vary in size and shape. As shown in FIGS. 1A-1C, some panels are generally rectangular (1), while others may have a more square aspect ratio (2). Even among similarly shaped panels, though, the lengths and widths of the panels vary, especially between different manufacturers.

Most flat photovoltaic solar panels typically comprise an aluminum frame around the panel to allow the panel to be mounted on a support structure. The frame has a folded "lip" on the back side of the panel having pre-drilled holes for mounting. As illustrated in FIG. 1A, for example, two solar panels 1, 2 have different dimensions (L×W), but both include an aluminum frame 3, 4 with mounting holes located thereon. The aluminum frame is generally mounted along a top surface of the panel, but is offset on the back side of the panel, leaving a gap or space between the back of the panel and a lip or rim 5, 6 of the frame (the lip folded toward the center of the panel). As shown FIG. 1A, the mounting holes in each panel's frame are obviously not located in the same positions as the holes in the other panel's frame.

Not only are the mounting holes in the frames not aligned along the long edge of each panel, the holes also vary in distance from the edge of the frame rim 5, 6. This is illustrated in FIG. 1D. A mounting hole 8 located on a solar panel frame lip 7 has a left tangential edge 81, and a right tangential edge 82. The present inventors have determined that typically the mounting hole 8 will be located somewhere in a zone (or band) between a left edge A and a right edge B. In other words, the left tangential edge 81 of the mounting hole 8 may have a maximum displacement to the left up to edge A, and similarly, the right tangential edge 82 of the mounting hole 8 may have a maximum displacement to the right up to edge B.

In practice, the zone of hole locations (A to B) is generally located from about 0.25" to 2" from the outer edge of the solar panel mounting frame lip 7. A majority of solar panel manufacturers appear to locate their mounting holes within a band located about 0.5" to 1.25" from the outer edge of the solar panel mounting frame lip 7.

Therefore, in order to provide a universal solar array mounting system that can be used with many different sized solar panels, the system must be able to accommodate mounting holes located at different positions. While it is technically possible to "mix and match" different sized panels within a single installation, it is presumed herein that for a given "row" of panels, the panels are all of the same dimensions, and the mounting holes are located in the same locations on each panel.

A first embodiment of a solar panel array mounting system 10 according to the present invention is illustrated in FIGS. 2A-2D. Generally, each section of a solar panel array 12 has two A-shaped support members 14, 16. More than two A-shaped support members may be used as desired to respond to local conditions or system loads. These A-shaped support members 14, 16 preferably have front and rear mounting skids 141, 142 and 161, 162, respectively. The A-shaped support members 14, 16 are especially suitable for ground mount installations, either utilizing ballasting supports when disturbing the ground may be undesirable, or by attaching directly to the ground using poured concrete footings or other ground penetrating and attaching systems.

Two lateral support members 18, 20 are attached to each A-shaped support member 14, 16. The lateral support members 18, 20 may be made from any suitable material and have any shape (i.e. round tubing, square rails, etc.). In a preferred embodiment, the lateral support members 18, 20 are preferably galvanized mechanical tubing, with a diameter of 1.5" to 5".

Each solar panel in the array 12 is attached to the two lateral support members 18, 20 via special clamps (described in detail below with respect to FIGS. 4A-4G). The lateral support members 18, 20 are therefore aligned with the mounting holes of the panels in the array 12. The top lateral support member 18 attaches to the A-shaped support members 14, 16 via a top bracket (shown in detail in FIGS. 3A-3C).

The bottom lateral support member 20 attaches to a tilt arm 22, 24 attached to each A-shaped member 14, 16, respectively. Each tilt arm 22, 24 can attach to the lower lateral support member 20 via standard U-shaped bolts. The tilt arms attach to the respective A-shaped support members anywhere along a front leg. Since the relative distances from the top and bottom mounting holes on the solar panels will vary from installation to installation, the tilt arms are mountable along the front leg. The exact location may be higher or lower along the front leg, depending on the panels used. The tilt arms 22, 24 can be attached to the A-shaped support members 14, 16 as described below. The tilt arms can be designed in different fixed lengths to provide a desired tilt angle for the panels in the array 12 for different installations where local conditions may call for different orientations to the suns rays. A shorter tilt arm will provide a steeper angle, and a longer arm will provide a lower angle.

Figures 3A, 3B, 3C:
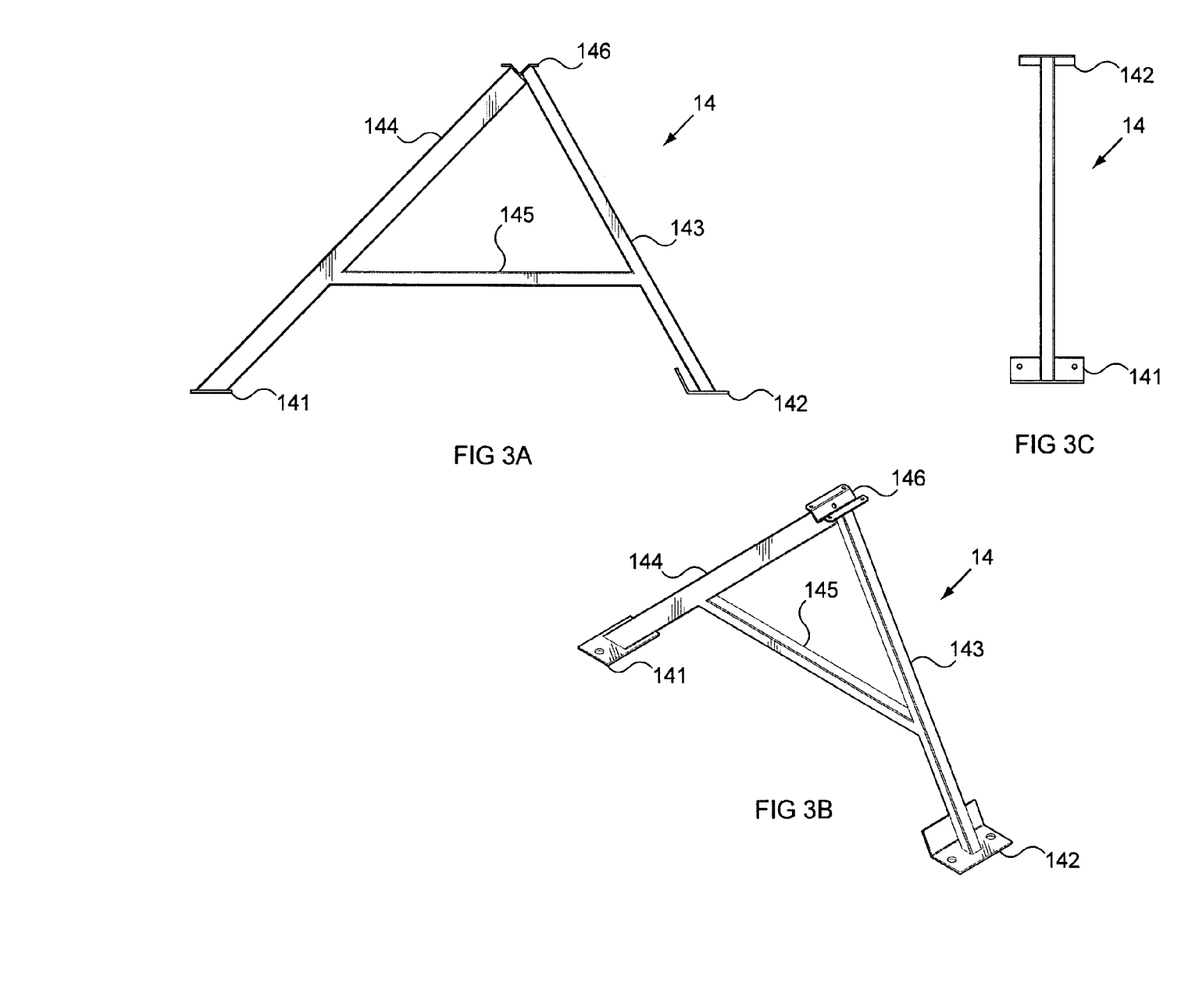
FIG. 3A is a side view of an A-shaped support member according to one embodiment of the present invention.
FIG. 3B is a rear perspective view of the A-shaped support member of FIG. 3A.
FIG. 3C is a top view of the A-shaped support member of FIG. 3A.

The A-shaped support member 14 is shown in greater detail in FIGS. 3A-3C. In one embodiment an A-shaped support member 14 includes a front leg 144 and a rear leg 143, joined by a cross support 145, which form a support frame having a generally "A-shaped" appearance. Each leg includes a mounting plate or skid plate 141, 142 for tying down the system. These skid plates 141, 142 allow for leveling adjustment of the array in response to surface conditions, which makes the design especially suited for ground mount installations. At the top of the frame 14, where the front leg 144 and rear leg 143 join, a mounting bracket 146 is attached. This mounting bracket 146 is configured to receive the top lateral support member. In the case of round metal tubing, the mounting bracket can be attached to the lateral support member using standard U-bolts, for example.

A novel clamp design according to one embodiment of the present invention is illustrated in FIGS. 4A-4H. This clamp 30 is especially suited for mounting solar panels whose mounting holes are located at varying distances from the edge of a panel frame lip. As shown in the figures, the clamp 30 is formed in two main sections a top section 32 and a rear section 34. The two sections 30, 32 are configured to attach together around a lateral support member. The embodiment shown is a clamp for round support tubing, but the clamp shape 343 can be configured to clamp around other shaped lateral support members (i.e. square).

Figures 4A, 4D:
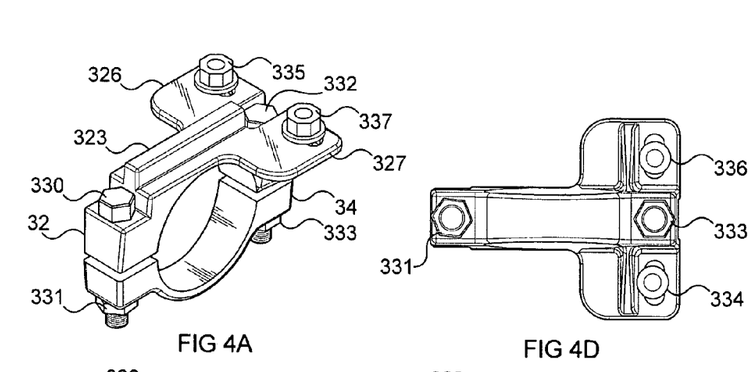
FIG. 4A is a perspective view of a clamp according to one embodiment of the present invention.
FIG. 4D is a bottom view of the clamp of FIG. 4A.
Figure 4B:
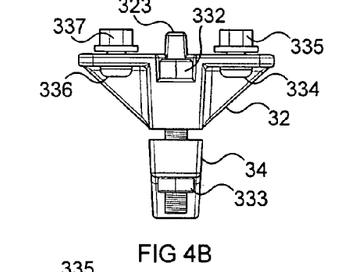
FIG. 4B is a top end view of the clamp of FIG. 4A.
Figure 4C:
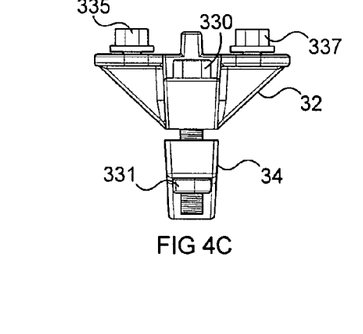
FIG. 4C is a bottom end view of the clamp of FIG. 4A.
Figure 4E:
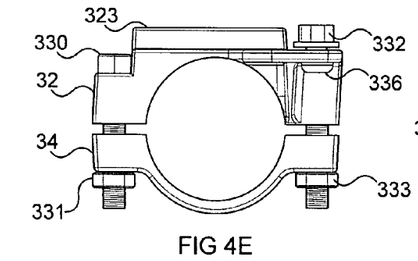
FIG. 4E is a side view of the clamp of FIG. 4A.
Figure 4F:
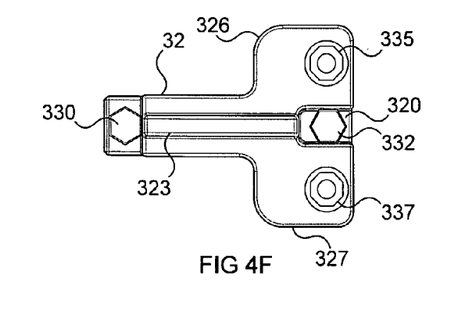
FIG. 4F is a top view of the clamp of FIG. 4A.
Figure 4G:
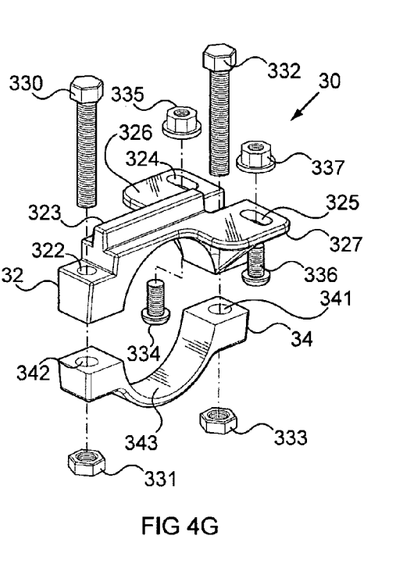
FIG. 4G is an exploded view of the clamp of FIG. 4A.
Figure 4H:
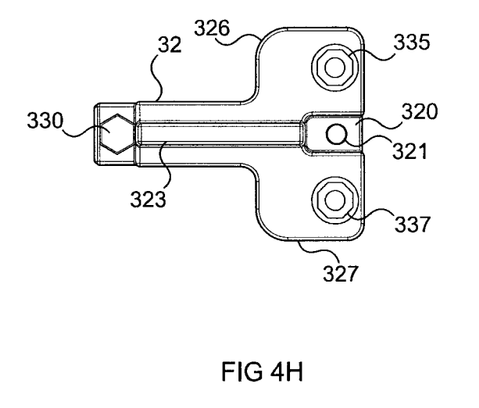
FIG. 4H is a top view of the clamp of FIG. 4A.

The top section 32 includes two fins 326, 327 having two elongated holes (slots) 324, 325. While the elongated holes 324, 325 are shown enclosed, they could be constructed as open ended slots as well. The elongated holes 324, 325 are designed to provide alignment with mounting holes which may be located different distances from the edge of a solar panel. Specifically, the elongated holes 324, 325 are configured to align with the band or zone mounting holes, as illustrated in FIG. 1D. For example, in one embodiment the holes are 0.35×0.75 inches, are spaced approximately 1.4 inches apart at the inner edges, and align with solar panels whose mounting holes are located within a band of 0.5" to 1.25" from the edge of solar panel frame. The clamp 30, of course, can be designed to align with whatever desired range of distances a system installer may require.

The top section 32 may include a spacer fin 323. The spacer fin 323 provides a fixed stop between adjacent panels, allowing for fixed spacing between panels. In a preferred embodiment the spacer fin 323 is 0.375 inches wide. The top section is also preferably configured with a slot 320 which is sized to fit the head of an attachment bolt 332. With this configuration, the corresponding attachment nut 333 can be tightened with only one wrench or socket. The top section 32 includes a top attachment hole 321 (see FIG. 4H), and a bottom attachment hole 322. These holes 321, 322 align with corresponding attachment holes 341, 342 on the rear section 34. The top section 32 and rear section 34 are attached around a lateral support member using standard hardware, such as bolts 330, 332, and corresponding nuts 331, 333. Standard mounting hardware, such as bolts 334, 336 and nuts 335, 337 are used to attach the clamp to the mounting holes of adjacent solar panels.

As can be appreciated, the clamp design of the present invention illustrated in FIGS. 4A-4H can be modified in size and shape to accommodate particular needs. For example, special "end" brackets can be used having only one fin and slot—one style for left ends of a row, and a symmetric one fin design for right row ends. Alternatively, a standard panel clamp can be used at either end of row by attaching the respective end panel to only the outside elongated hole, effectively locating the clamp under each end panel. It can also be appreciated that particular elements such as the standard fasteners can be replaced with custom elements or entrapped fastening devices, whereby the use of nuts could be replaced with threaded holes or the use of bolts could be replaced with pre-threaded studs, for example.

Figure 5A:
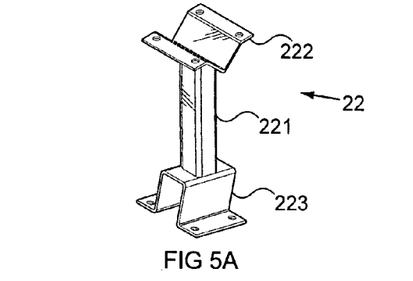
FIG. 5A is a side perspective view of a tilt arm according to one embodiment of the present invention.
Figure 5B:
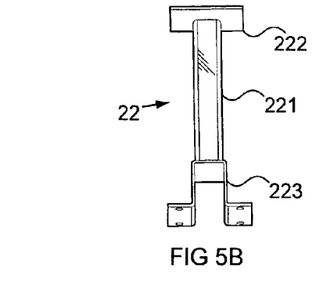
FIG. 5B is a rear perspective view of the tilt arm of FIG. 5A.
Figure 5C:
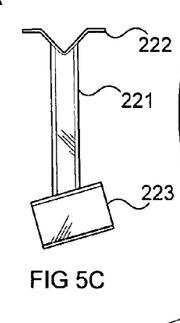
FIG. 5C is a side view of the tilt arm of FIG. 5A.
Figure 5D:
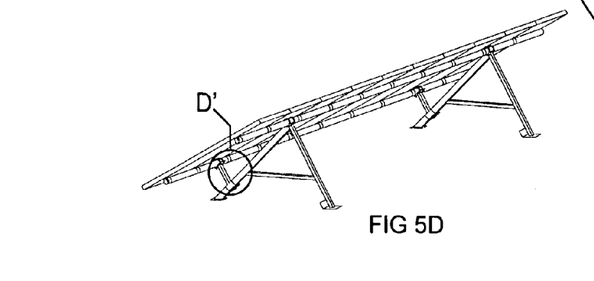
FIG. 5D is a rear perspective view of the mounting system according to one embodiment of the present invention having a tilt arm as shown in FIG. 5A.

A tilt arm according to one embodiment of the present invention is shown in greater detail in FIGS. 5A-5D'. Specifically, a tilt arm 22 includes a top mounting bracket 222 for attaching the tilt arm to a lower lateral support member. As shown, for a round lateral support member, the bracket can be attached using standard U-bolts 226, 227. The arm section 221 can be manufactured in different lengths to provide a desired tilt angle for the solar array. The end bracket 223 is configured to fit on the front leg of an A-shaped support member. In a preferred embodiment, the front leg is rectangular in cross-section, so the end bracket 223 is designed to fit tightly around three sides of the leg, and has tabs on each side with holes for attachment. As shown in FIG. 5D', the end bracket 223 can be attached to the leg using two mounting straps 224, 225 and associated hardware, or a single plate could be used. Since the tilt arm 22 does not have to be located at any specific point along the front leg, the system can be used to install arrays in which the distance between the top and bottom lateral support members may vary (i.e. the distance between the top and bottom mounting holes on the panels may vary).

Since the clamps and tilt arms allow for variations in the locations of the mounting holes, the same mounting system design can be used for installations with different panel sizes. This greatly reduces the number of separate parts that need to be designed and kept in inventory, while simultaneously giving system installers the flexibility to use different manufacturers PV panels.

Figure 6A:
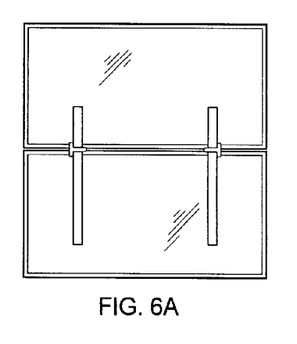
FIG. 6A is a bottom view of two solar panels.
Figure 6B:
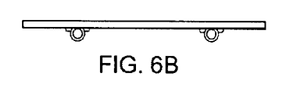
FIG. 6B is a side view of the panels of FIG. 6A.
Figure 6C:
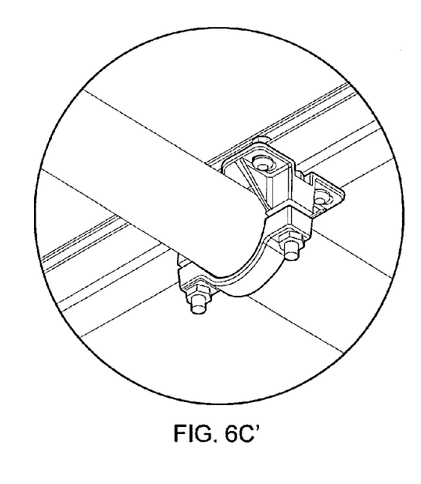
FIG. 6C is an underside perspective view showing the attachment of clamps to the lateral support members and two solar panels.
Figure 6D:
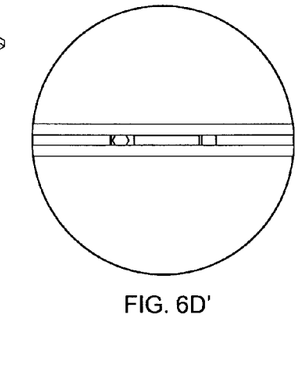
FIG. 6D is a top view of the two solar panels of FIG. 6A.

As illustrated in FIGS. 6A-6D', an additional advantage of the present invention is that all the clamping of the panels occurs on the rear of the panel, so the front of the array has a very smooth and clean appearance. As shown in FIG. 6D and the enlarged view of FIG. 6D', only the spacer fin of the clamp is visible from the front of the panels.

For ease of installation, the solar panels for a row can be laid upside down on a support (such as a wood frame support by sawhorses). Then, the front section of the clamps can be attached to the mounting holes of each panel, via the elongated holes on the clamp fins. With the front section of the clamps in place, the lateral support members can be placed in the clamps. The rear sections of each clamp can then be attached around the lateral support members to their respective front sections. With the lateral support members in place, the entire assembly can be lifted into place onto the A-shaped support members. The location of the tilt arms can be adjusted, if necessary, to align the tilt arm mounting bracket with the bottom lateral support member. The assembly can then be attached to the A-shaped support member brackets via U-bolts, or other suitable hardware.

Figure 7:
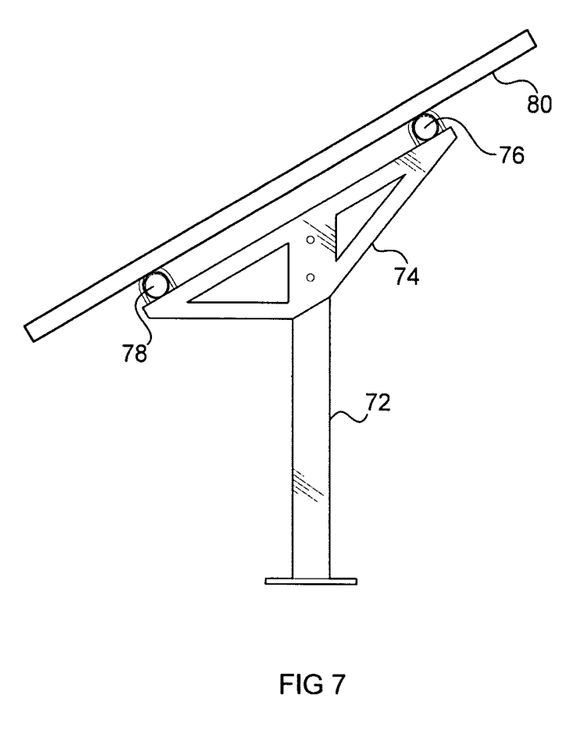
FIG. 7 is a side view an alternative embodiment of a solar panel mounting system.
Figures 8A, 8B:
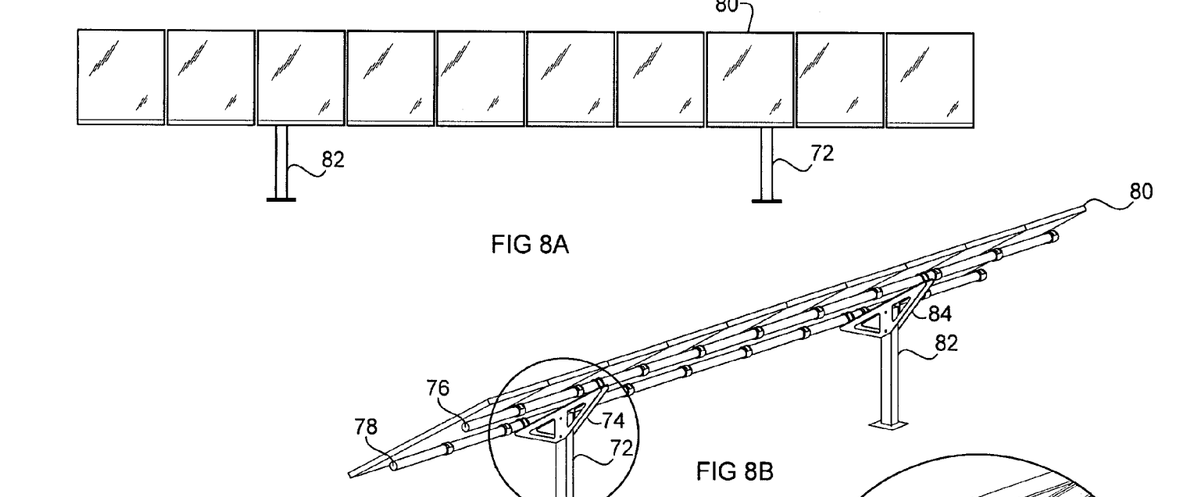
FIG. 8A is a front view of the solar panel mounting system of FIG. 7.
FIG. 8B is a rear perspective view of the system of FIG. 8A.
Figure 8C:
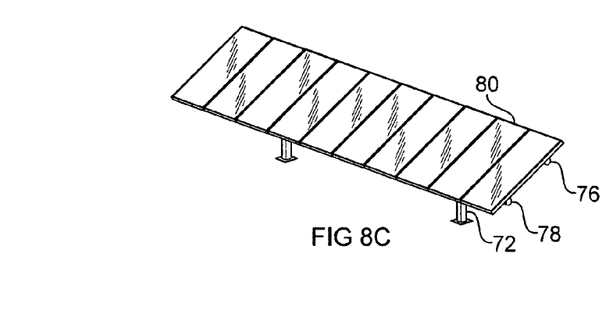
FIG. 8C is a front perspective view of the mounting system of FIG. 8A.
Figure 8D:
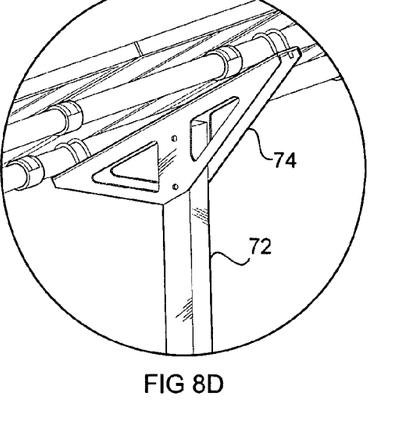
FIG. 8D is an enlarged view of the system of FIG. 8B, illustrating a mounting bracket according to one embodiment of the present invention

An alternative embodiment of the present mounting system is shown in FIG. 7. Instead of using A-shaped support members, standard posts 72 can be used. The posts are preferably square, but they can be other shapes as well. A post mounting bracket 74 attaches the post to the array.

As shown in FIGS. 8A-8D, an array 80 of solar panels is attached to a top 76 and bottom 78 lateral support members. The individual panels are attached via the clamps described with respect to FIGS. 4A-4G. The lateral members are then attached to the two posts 72, 82 via a post mounting bracket 74, 84. More posts can be used in a row as desired. The array 80 is then attached to the post mounting brackets by U-bolts, are other similar hardware. In this configuration, the post mounting brackets 74 may be custom sized for each type of panels to be installed, or the bracket may include multiple sets of mounting holes, or slots, on the top surface of the bracket in order to accommodated panels of different sizes.

Those skilled in the art will appreciate that various adaptations and modifications of the just-described preferred embodiments can be configured without departing from the scope and spirit of the invention. Therefore, it is to be understood that, within the scope of the appended claims, the invention may be practiced other than as specifically described herein.

What is claimed is:

1. A solar panel mounting system comprising:
   at least two A-shaped support frames, each A-shaped support frame including a respective top bracket;
   a tilt arm connected to an A-shaped support frame at a position along a front of the A-shaped support frame, such that each A-shaped support frame has a respective tilt arm;
   a top lateral support member connected to the at least two A-shaped support frames at each respective top bracket;
   a bottom lateral support member connected to each respective tilt arm, wherein each tilt arm is attached to an A-shaped support member at a location to align the bottom lateral support member with at least one bottom mounting hole on a solar panel frame; and
   a first solar panel clamp attached to the top lateral support member; and a second solar panel clamp attached to the bottom lateral support member, wherein the first and second panel clamps comprise:
   a top section comprising:
      at least one elongated slot for aligning with a mounting hole on a solar panel; and
      a spacer fin configured to provide a fixed gap between adjacent solar panels;
   a rear section;
   mounting hardware to attach the top and rear sections together around a lateral support member;
   a first solar panel having a frame connected to a first side of the first and second solar panel clamps; and
   a second solar panel having a frame connected to a second side of the first and second solar panel clamps;
   wherein the spacer fin of each solar panel clamp provides a fixed gap between the first and second solar panels.

2. The mounting system of claim 1, wherein the at least one elongated slot is sized to accommodate solar panel mounting holes which are located in a band approximately 0.5" to 1.25" from an edge of a solar panel frame.

3. The mounting system of claim 1, wherein the at least one elongated slot is sized to accommodate solar panel mounting holes which are located in a band approximately 0.2.5" to 2" from an edge of a solar panel frame.

4. The mounting system of claim 1, wherein the top and rear sections are configured to attach to a round metal support tube.

5. The mounting system of claim 1, wherein the top section comprises two elongated slots for aligning with mounting holes on adjacent solar panels in an array.

6. The mounting system of claim 5, herein the two elongated slots are enclosed elongated holes approximately 0.35× 0.75 inches, and spaced approximately 1.4 inches apart at their inner edges.

7. The mounting system of claim 1, wherein the top section further comprises a top attachment hole and a bottom attachment hole, and the rear section comprises a top attachment hole and a bottom attachment hole.

8. A solar panel mounting system comprising:
   at least two mounting posts;
   a mounting bracket connected at a top of a mounting post;
   a top lateral support member connected to each mounting bracket;

a bottom lateral support member connected to each mounting bracket at a location to align the bottom lateral support member with at least one bottom mounting hole on a solar panel frame; and a first solar panel clamp attached to the top lateral support member; and a second solar panel clamp attached to the bottom lateral support member, wherein the first and second panel clamps comprise:

a top section comprising:

at least one elongated slot for aligning with a mounting hole on a solar panel; and a spacer fin configured to provide a fixed gap between adjacent solar panels;

a rear section;

mounting hardware to attach the front and rear sections together around a lateral support member; and a first solar panel having a frame connected to a first side of the first and second solar panel clamps; and a second solar panel having a frame connected to a second side of the first and second solar panel clamps;

wherein the spacer fin of each solar panel clamp provides a fixed gap between the first and second solar panels.

9. The mounting system of claim 8, wherein the at least one elongated slot is sized to accommodate solar panel mounting holes which are located in a band approximately 0.5" to 1.25" from an edge of a solar panel frame.

10. The mounting system of claim 8, wherein the at least one elongated slot is sized to accommodate solar panel mounting holes which are located in a band approximately 0.25" to 2" from an edge of a solar panel frame.

11. The mounting system of claim 8, wherein the top and rear sections are configured to attach to a round metal support tube.

12. The mounting system of claim 8, wherein the top section comprises two elongated slots for aligning with mounting holes on adjacent solar panels in an array.

13. The mounting system of claim 12, wherein the two elongated slots are enclosed elongated holes approximately 0.35×035 inches, and spaced approximately 1.4 inches apart at their inner edges.

14. The mounting system of claim 8, wherein the top section further comprises a top attachment hole and a bottom attachment hole, and the rear section comprises a top attachment hole and a bottom attachment hole.

15. The mounting system of claim 8, wherein the top section further comprises a spacer fin to provide a fixed gap between adjacent solar panels.

16. The mounting system of claim 15, wherein the spacer fin is 0.375 inches wide.

* * * * *